(12) United States Patent
Corse et al.

(10) Patent No.: US 7,145,410 B2
(45) Date of Patent: Dec. 5, 2006

(54) WIRELESS COMMUNICATION TERMINAL AND VOLTAGE CONTROLLED OSCILLATOR THEREFOR

(75) Inventors: Nir Corse, Tel Aviv (IL); Shay Nir, Tel Aviv (IL); Mark Rozental, Tel Aviv (IL)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/823,052

(22) Filed: Apr. 13, 2004

(65) Prior Publication Data
US 2004/0222858 A1    Nov. 11, 2004

(30) Foreign Application Priority Data
Apr. 29, 2003  (GB) ................................. 0309750.8

(51) Int. Cl.
  *H03L 7/09*   (2006.01)
  *H03B 5/08*   (2006.01)
  *H03B 5/18*   (2006.01)
(52) U.S. Cl. ............... 331/177 V; 331/36 C; 331/117 R; 331/167
(58) Field of Classification Search ............ 331/177 R, 331/177 V, 36 C, 117 R, 167
See application file for complete search history.

(56) References Cited

U.S. PATENT DOCUMENTS 4,939,481 A * 7/1990 DaSilva .................. 331/117 R
5,942,950 A * 8/1999 Merenda ....................... 331/99
5,987,331 A * 11/1999 Grube et al. ................. 455/509
6,075,421 A * 6/2000 Chong ..................... 331/117 R
6,218,909 B1 * 4/2001 Eban ...................... 331/117 R
6,906,596 B1 * 6/2005 Kitamura et al. .......... 331/36 C

FOREIGN PATENT DOCUMENTS

JP          100065444 A      3/1998
WO        WO 02/09269 A1    1/2002

* cited by examiner

Primary Examiner—Robert Pascal
Assistant Examiner—James Goodley

(57) ABSTRACT

A wireless communication unit (100) comprises a voltage controlled oscillator (123) having an active device (450) operably coupled to a first variable capacitance (425) to provide a variable capacitance value based on an applied steering line voltage, and a feedback network comprising a resonator (475), operably coupled to an output of the active device, for feeding power back to an input of the active device to sustain oscillations (123). Notably, a second variable capacitance is operably coupled to receive a control voltage from the steering line (405) and located between the resonator (475) and the active device (450).

12 Claims, 3 Drawing Sheets

123

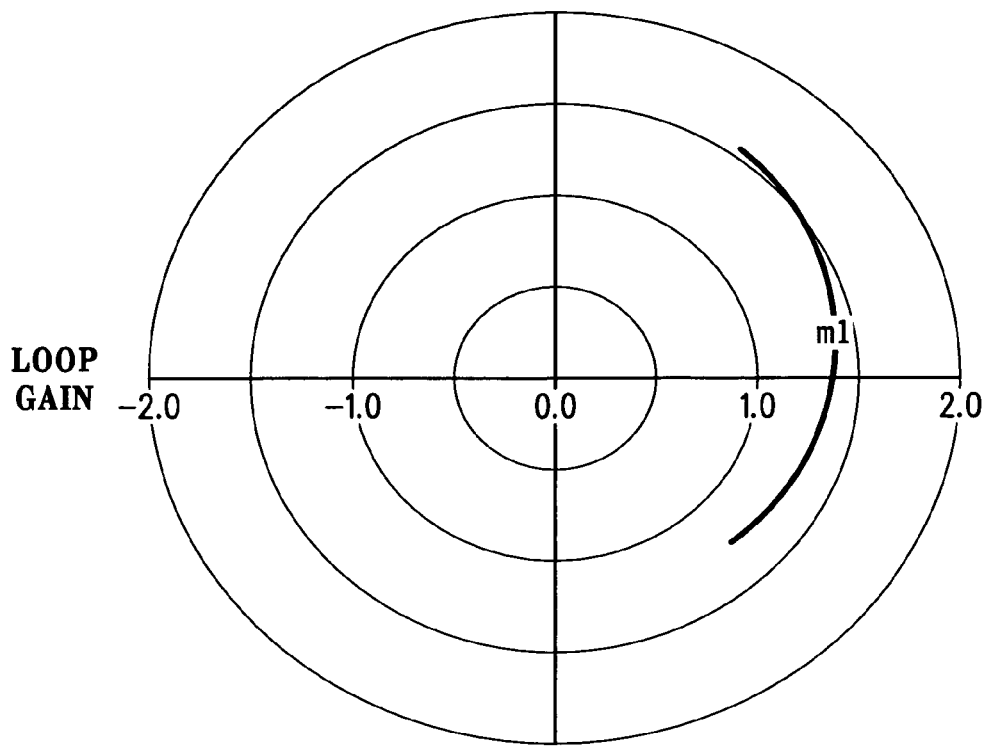
FIG. 2B  200   VOLTAGE
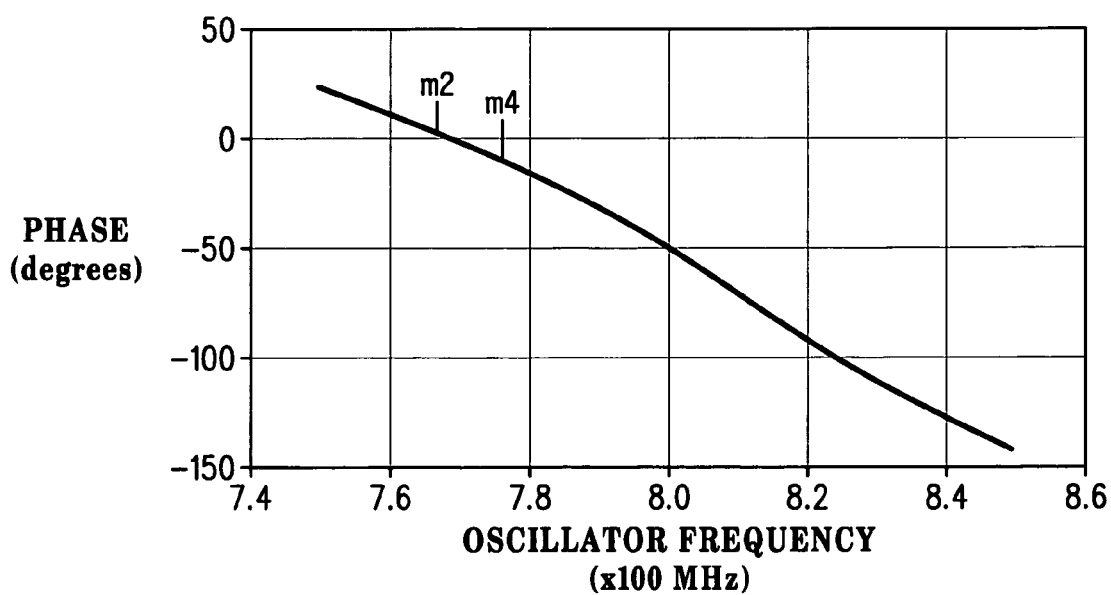
300  FIG. 3

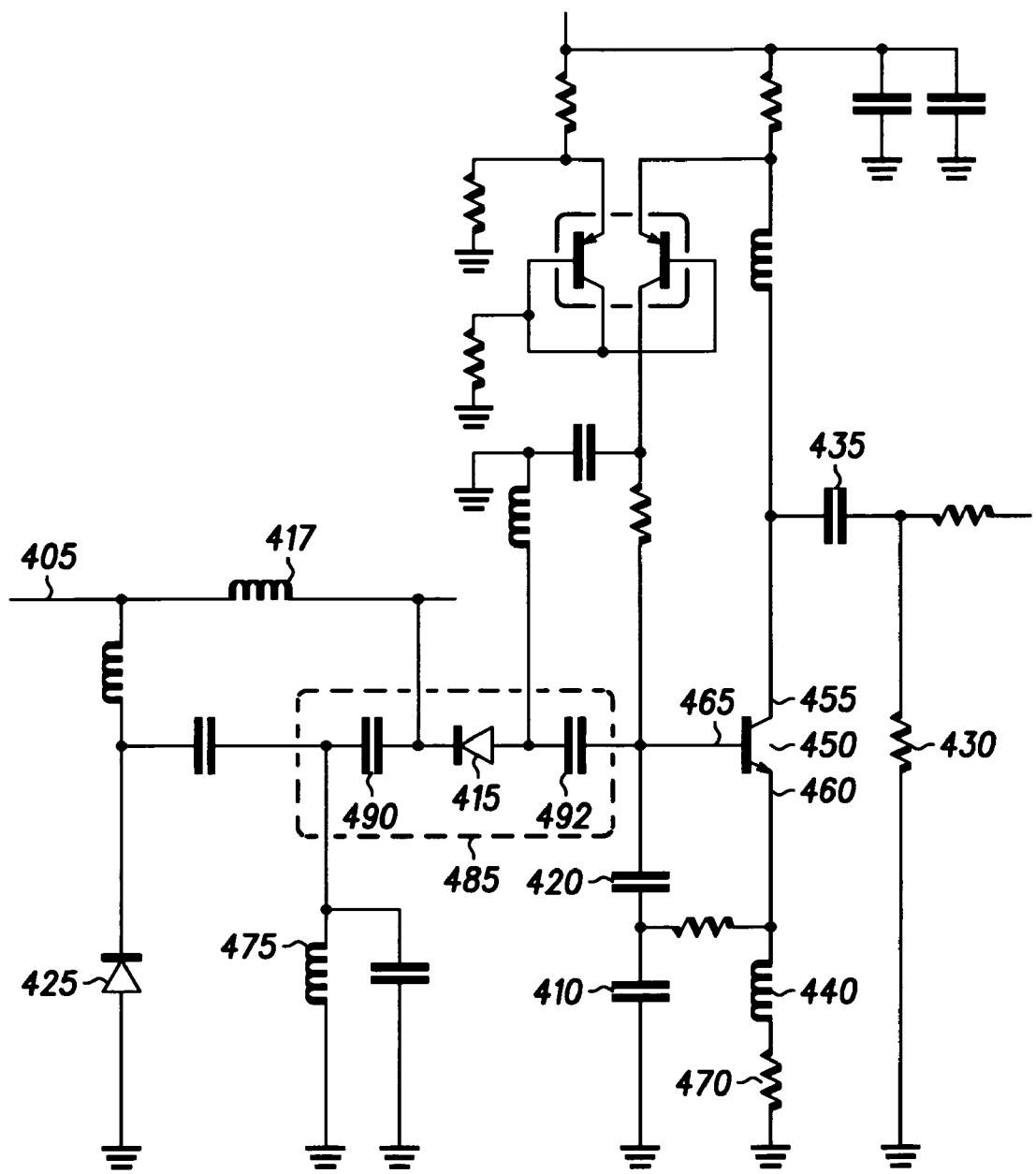
123  *FIG. 4*

WIRELESS COMMUNICATION TERMINAL AND VOLTAGE CONTROLLED OSCILLATOR THEREFOR

FIELD OF THE INVENTION

This invention relates to a wireless commnunication terminal and a voltage controlled oscillator therefor. The invention is applicable to, but not limited to, a voltage controlled oscillator (VCO) for generating radio frequencies across a wide frequency range and/or over a number of distinct frequency bands.

BACKGROUND OF THE INVENTION

Wireless subscriber communication units, for example those operating in a cellular telephone system such as the Global System for Mobile communications (GSM) or operating on a private mobile radio system such as a TErrestrial Trunked RAdio (TETRA) communication system, use oscillator circuits to generate the radio frequency signals.

An oscillator circuit has two primary functions:

(i) An active device, such as a transistor, to produce power gain; and (ii) A feedback network, routeing a sufficient amount of the active device's output signal to an input of the active device, to sustain oscillations. In effect, the component values of the feedback network determine the operating frequency. The circuit oscillates when the product of the transistor gain times the network losses (including any mismatches) substantially equals '1'. In practice, the product is set to a value slightly higher than '1' so that oscillations can start and build up to a high level.

A common oscillator implementation is known as a voltage controlled oscillator (VCO) circuit, where an input tuning voltage is applied to an oscillator circuit and the tuning voltage adjusted to set the frequency at which the circuit oscillates. The frequency range of the VCO circuit is limited to circuit component parameters and the tuning voltage used.

Note that a narrow band VCO circuit is typically defined as:

$$(F_{max}-F_{min})/F_{average} < 10\% \text{ of } F_c.$$

That is, a narrowband VCO is typically considered to have an acceptable frequency range of less than ten percent of its nominal oscillating frequency.

However, the widespread adoption of wireless technologies has created a need to allocate frequency spectrum in separate frequency bands to accommodate all potential users of that communication technology. For example, GSM spectrum has been allocated in both the 800 MHz frequency band as well as the 900 MHz frequency band. In addition, TETRA has been allocated frequency spectrum in the 380–400 MHz frequency band, as well as the 410–430 MHz frequency band.

Thus, to avoid manufacturing different wireless subscriber communication units (terminals) for different frequency bands, wireless subscriber unit manufacturers need to develop wireless subscriber communication units capable of operating over a wider frequency range. In this manner, a single wireless subscriber communication unit is then able to encompass all potential frequencies supported by the respective communication standard.

One option to support a wide frequency range within a single wireless subscriber communication unit is to design two separate VCO circuits.

An alternative approach would be to provide a wideband voltage controlled oscillator (VCO). Developing a single wideband VCO to operate across the desired frequency range saves cost and space, when compared to the alternative solution of designing two separate VCO circuits.

However, the implementation of a 'wideband' VCO is more complex. Furthermore, the inventors of the present invention have recognised that a significant disadvantage with such wideband VCO designs is that VCO phase noise degrades over the frequency band. This problem is exacerbated as the VCO bandwidth increases. Increasing the VCO tuning bandwidth, particularly over say 10% of its centre frequency, has noticeably increased this effect in a traditional Colpitts VCO configuration. This effect is noticeable irrespective of the VCO component values used.

In the known Colpitts VCO design, for the sole purpose of tuning the VCO frequency is typically shifted using a single variable capacitor. Occasionally, two variable capacitors may be used, again for the sole purpose of tuning the VCO frequency. It can be shown that increasing a VCO frequency range will increase the amount of capacitance change in the VCO using the variable capacitor. The increased capacitance change will increase the variable capacitance losses as well.

Generally, any attempt to improve a loaded-Q performance at high tuning voltages results in a lower gain margin at low tuning voltages. This, in turn, leads to oscillation start up problems, particularly in a traditional Colpitts VCO configuration.

Thus, there exists a need to provide a wireless communication unit that can operate over a wide frequency range. In particular, there exists a need for an improved VCO design to maintain low phase noise across the wide frequency range.

SUMMARY OF INVENTION

In accordance with a first aspect of the present invention, there is provided a wireless communication terminal. The wireless communication terminal comprises a voltage controlled oscillator having an active device, for producing a power gain, operably coupled to a main variable capacitance, whose capacitance varies according to a voltage applied to a steering line. A feedback network, comprising a resonator, is operably coupled to an output of the active device for feeding power back to an input of the active device to sustain oscillations. Notably, a second variable capacitance is also operably coupled to the steering line voltage and located between the resonator and the active device.

In accordance with a second aspect of the present invention there is provided a voltage controlled oscillator circuit for use in the wireless communication terminal.

The provision of an additional (second), variable, tuning capacitance, located adjacent to the resonator enables a VCO to operate over a wider bandwidth with the same tuning voltages, say around 15% of the VCO's centre frequency. This is achieved, effectively, due to the use of gain margin tuning applied to the resonator and second variable capacitor of the VCO circuit. In particular, the provision of an additional (second) variable capacitor located adjacent to the resonator provides an increase in loaded-Q at high tuning voltages, i.e. it provides better phase noise at those frequencies. It also provides an increase in gain margin at low frequencies, i.e. it insures a minimum gain margin to provide sufficient oscillation, thereby providing greater start-up confidence at low tuning voltages. In this manner, the present invention solves the problem of lack of gain margin in a traditional Colpitts VCO configuration that would have resulted in oscillation start-up problems in the lower tuning voltage range.

Further features of the present invention are defined in the dependent Claims.

Exemplary embodiments of the present invention will now be described, with reference to the accompanying drawings, in which:

BRIEF DESCRIPTION OF THE DRAWINGS

FIG. 3 shows a graph illustrating a VCO loop gain analysis in a steady state (large signal) mode; and FIG. 4 illustrates a Colpitts VCO configuration adapted to support the various inventive concepts of the present invention.

DESCRIPTION OF EMBODIMENTS OF THE INVENTION

Figure 1:
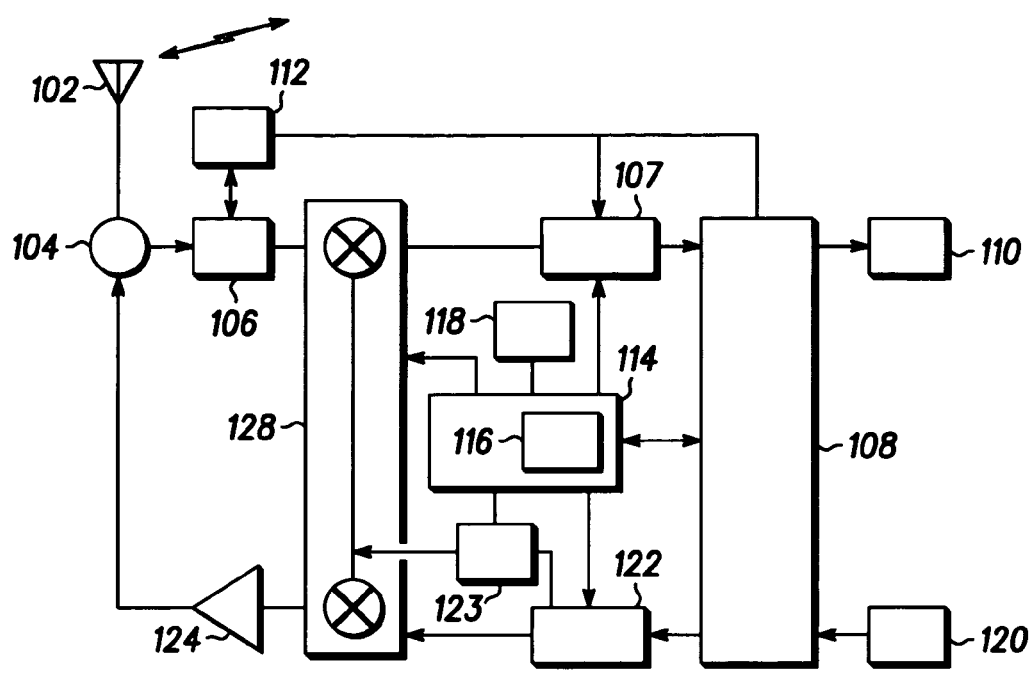
FIG. 1 illustrates a block diagram of a wireless communication unit adapted to support the various inventive concepts of the present invention.

A block diagram of a wireless subscriber communication unit (often termed mobile station (MS)) 100 is shown in FIG. 1. The MS 100 is adapted to support the inventive concepts of the preferred embodiments of the present invention. The MS 100 contains an antenna 102 preferably coupled to a duplex filter or antenna switch 104 that provides isolation between receive and transmit chains within the MS 100.

The receiver chain includes receiver front-end circuitry 106 (effectively providing reception, amplification and filtering of the received signal). The received signal is input to a frequency conversion circuit 128 that receives a reference oscillator signal from the frequency generation circuit 123. The frequency conversion circuit 128 preferably comprises mixing and amplifier elements (not shown), as known in the art. The frequency conversion circuit 128 is serially coupled to a signal processing function (generally realised by a digital signal processor (DSP)) 108 via a baseband (back-end) processing circuit 107.

A controller 114 is operably coupled to the frequency generation circuit 123 and/or frequency conversion circuit 128. A received signal strength indication (RSSI) function 112 provides receive bit-error-rate (BER) calculations, or frame-error-rate (FER) calculations or similar link-quality measurement data to the processor 108. The RSSI function 112 is operably coupled to the front-end circuit 106. A memory device 116 stores a wide array of MS-specific data, for example decoding/encoding functions, frequency and timing information for the communication unit, etc. A timer 118 is operably coupled to the controller 114 to control the timing of operations, namely the transmission or reception of time-dependent signals, within the MS 100. As known in the art, received signals that are processed by the signal processing function are typically input to an output device 110, such as a speaker or visual display unit (VDU).

The transmit chain essentially includes an input device 120, such as a microphone, coupled in series through a processor 108, transmitter/modulation circuitry 122, frequency generation/conversion circuit 128 and a power amplifier 124. The processor 108, transmitter/modulation circuitry 122 and the power amplifier 124 are operationally responsive to the controller. An output from the power amplifier is coupled to the duplex filter or antenna switch 104, as known in the art.

In accordance with a preferred embodiment of the present invention, the radio frequency generation circuit 123, which is a voltage controlled oscillator circuit, has been adapted to improve the phase noise at a high tuning voltage by improving the loaded-Q performance. The improved radio frequency generation circuit 123 is illustrated in FIG. 4. The preferred mechanism proposes the use of an extra tuning capacitor to present sufficient phase noise performance at high tuning voltages, whilst the tuning circuit preserves start up oscillation condition criteria at lower tuning voltages. In this manner, the present invention solves the problem of lack of gain margin in a traditional Colpitts VCO configuration that would have resulted in oscillation start-up problems in the lower tuning voltage range. Notably, the main variable capacitor and the additional variable capacitor proposed in the preferred embodiment of the present invention use the same steering line of the loop filter.

The memory device 116 has also been adapted to include a look-up table storing appropriate tuning voltage levels to be applied to the main and additional tuning capacitor to produce a desired output frequency of the frequency generation circuit 123 of the wireless communication unit 100.

Of course, the various components within the wireless communication unit 100 may be realised in discrete or integrated component form. Furthermore, it is within the contemplation of the invention that the wireless communication unit 100 may be any wireless communication device, such as a portable or mobile PMR radio, a mobile phone, a personal digital assistant, a wireless laptop computer, etc.

Furthermore, although the preferred embodiment of the present invention is described with reference to a voltage controlled oscillator circuit design in a MS 100, it is envisaged that the inventive concepts herein described are equally applicable to any VCO design, for example one located in a base transceiver station (BTS).

The preferred mechanism for determining the key RF VCO parameter values is to use a 'loop gain' analysis method. The 'loop gain' analysis method is a practical tool for estimating, for example, the oscillation frequency, start up states and loaded-Q at the operating point.

The loaded-Q value can be estimated using the following relationship:

$$Qloaded = f_{osc} \cdot \frac{d\Theta}{df} \cdot \left(\frac{1}{2 \cdot \Phi_{rad}}\right) \qquad [1]$$

Where:

Θ=loop gain phase, and $\Phi_{rad}$=57.3 degrees

The loop gain expression can be calculated using an analytical method, such as that described in "RF Oscillator Analysis and Design using Loop Gain method", authored by Noel Boutin and published in the trade journal "Applied Microwave and Wireless". Alternatively, numerical methods can be used, using simulation packages such as RF ADS Simulation. In this regard, the loop gain versus frequency and tuning voltage can be estimated by moving the ground, in FIG. 4, to the emitter port of the active device.

In this regard, let us first define some of the terminology associated with VCO circuit designs. The loop gain is a complex function of frequency 'w'. The loop gain can be expressed by the two real functions of 'w', namely: G(w), which is the magnitude function and □(w), which is the phase of the loop gain function. These functions can be plotted as a function of 'w'.

$$H_{CL}(jw) = \frac{A_{OL}(jw)}{1 + \beta_{OL}(jw) \cdot A_{OL}(jw)} \quad [2]$$

Loop Gain $(jw) = \beta_{OL}(jw) \cdot A_{OL}(jw) = G(w) \cdot e^{j\phi(w)}$

Where:

OL=Open Loop, and

CL=Closed Loop.

Notably, it is important to determine the margin of gain and phase that is required to ensure oscillation of the VCO circuit. In this regard, so long as the gain of the VCO circuit and the phase-shift around the VCO circuit is maintained within the margin parameters, the circuit will oscillate.

$\phi(W)|_{w=w_{OSC}}=0$ will result in $G(w_{OSC})$=Gain Margin  [3]

$G(w)|_{w=w_{PM}}=1$ will result in $\phi(W_{PM})+180$=Phase Margin [Degrees]

Where:

OSC=Oscillation, and

PM=Phase Margin.

In order to ensure oscillation based on a specific tuning voltage the gain margin should be greater than '1', and the phase margin '0'. Start-up parameters of the VCO circuit can be estimated using small signal analysis.

Figure 2A:
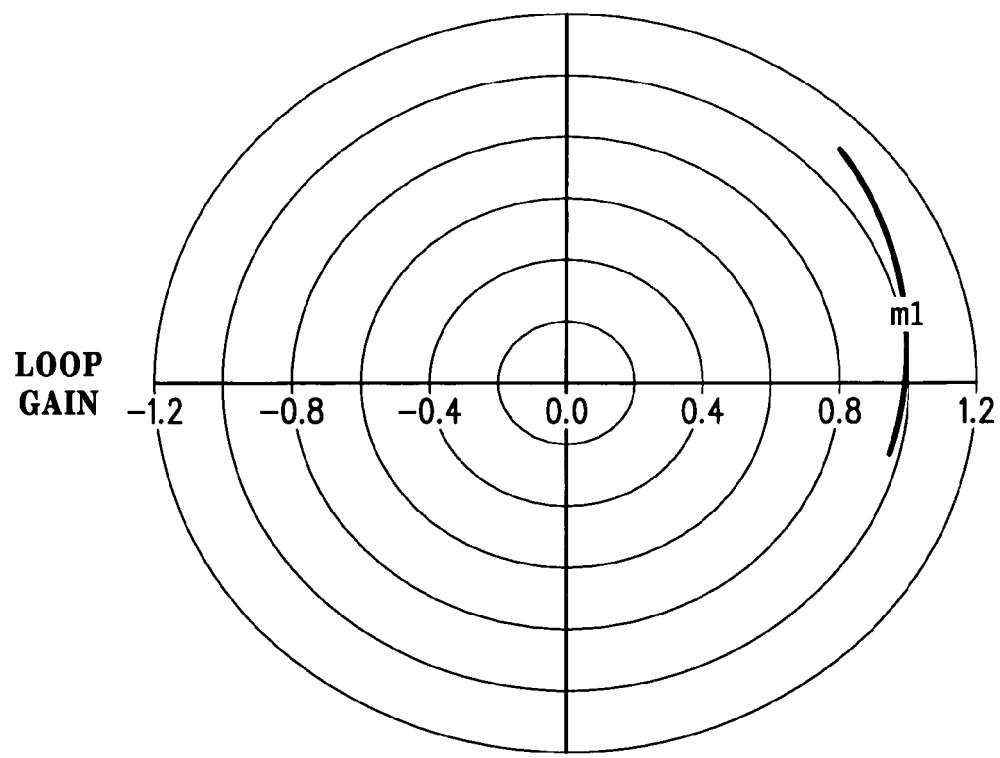
FIG. 2 shows a graph illustrating a VCO loop gain analysis in small signal mode.

Referring now to FIG. 2, two graphs 200, 210 are shown illustrating the VCO loop gain (curved line m1) versus voltage using small signal analysis. The first graph 200 in FIG. 2 illustrates the estimation of the VCO loop gain in small signal mode. This analysis is performed in order to test whether the oscillator has sufficient loop gain for start up across all the tuning voltages. Using small signal analysis, it is shown that the gain margin m1 of the circuit of FIG. 4 is approximately 1.389, which indicates that the illustrated oscillator will oscillate at 828 MHz. The second graph 210 in FIG. 2 illustrates the estimation of the VCO loop gain in a large signal mode. The gain margin m1 in this case is less than ~1.389 (noted using small signal analysis in a start-up mode) and is approximately '1' (1.009) at steady state.

Once the circuit has started to oscillate, the signal at the input to the transistor starts to build up, until the gain margin reaches a value of '1'. At that (steady state) stage the VCO circuit should be analysed using large signal simulation.

Applying Lesson's equation enables parameters such as loaded-Q, noise figure (NF) and power (at the input of the transistor 110) to be assessed against phase noise performance, as shown in equation [4] below. An increase in loaded-Q will result in more loss in the feedback, and less gain margin.

$$\xi(f_m) = \frac{FkT}{2P}\left(1 + \frac{f^2}{4Q_L^2 f_m^2}\right) \quad [4]$$

The phase of the loop gain, as illustrated in the second graph 210 of FIG. 2, is shown plotted against oscillator loop frequency in graph 300 of FIG. 3. This plot in conjunction with Equation 1 is used to estimate loaded Q. In FIG. 3, m2 is a result for a gain of −9.720 recorded at loop frequency 770 MHz and m4 is a result for a gain of 3.474 recorded at loop frequency 768 MHz. The loaded-Q result obtained is 9.863. Using a large signal analysis, the oscillator gain margin should equal '1'. When trying to estimate loaded-Q using equation [1], it is important to look at the loop phase at a steady state condition, as the loop phase value is different during the start-up rise time.

Thus, an accurate estimate of the loaded-Q cannot be performed just by using small signal analysis, as the oscillator is yet to reach a steady state condition. This leads to the conclusion that the loaded-Q value should be estimated at the operating point, i.e. using large signal simulation with gain margin equal to '0'.

In order to illustrate the variation of loaded-Q degradation versus frequency, prior to implementing the inventive concepts of the present invention, an 800 MHz VCO, employing a 3 mm resonator was used in a Colpitts configuration. The tuning band of the VCO was configured to be approximately 110 MHz, with the circuit analysed in a large signal mode. Table 1 illustrates the effect of a large tuning bandwidth over a degradation of loaded-Q. It is noteworthy that at high frequencies the gain margin increases with respect to frequency.

TABLE 1

| Tuning Voltage [v] | Oscillation Frequency [MHz] | Q Loaded | Gain Margin |
|---|---|---|---|
| 0.5 | 771 | 9.8 | 1.256 |
| 1.5 | 796 | 8.9 | 1.296 |
| 2.5 | 828 | 8.1 | 1.336 |
| 3.5 | 861 | 7.45 | 1.349 |
| 4.5 | 902 | 6.95 | 1.351 |

Notably, the table values were estimated using a capacitance $C_x$=8 pF. By decreasing the capacitance value to approximately $C_x$=3 pF, it was noted that the loaded-Q value increased dramatically at high frequencies, up to the values of the low frequencies. However, such a low capacitance value inevitably resulted in a decrease in gain margin, which potentially leads to oscillation start up problems.

Thus, in accordance with the preferred embodiment of the present invention, it is proposed that a variable capacitance is introduced for $C_x$. By providing a variable capacitance for $C_x$, it is possible to attain a high capacitor value at small tuning voltages and a small capacitor value at high tuning voltages. Advantageously, this concept also results in a lower $C_c$ value, which will reduce main variable capacitor losses.

A preferred embodiment of the present invention is described with reference to a Colpitts VCO configuration. However, it is within the contemplation of the present invention that the inventive concepts described herein are equally applicable to other known VCO configurations, as would be appreciated by a person skilled in the art.

FIG. 4 illustrates a Colpitts VCO configuration 123, which has been adapted in accordance with the preferred embodiment of the present invention. The Colpitts Oscillator circuit is a 750 MHz–870 MHz VCO circuit employing gain margin tuning. The feedback network of a Colpitts oscillator, i.e. the feedback from the emitter 460 to the base 465 of the transistor 450, comprises inductor L 440, and capacitors C1 420 and C2 410. The load resistor $R_L$ 430 is connected to the collector port 455 by a large-value capacitor $C_{coupling}$ 435. The large-value capacitor $C_{coupling}$ 435 is strictly used only for dc isolation. A biasing resistor network is used to ensure the appropriate voltages are applied to the transistor ports, noting that resistor 470 is not by-passed and remains a part of the active circuit.

As the base port potential 465 is by-passed to the power supply, the transistor 450 can be considered as operating in a common base configuration. The collector signal is then fed back to the emitter port 460 through the tapped-capacitor C1 420 and C2 410 chain, as known in the art.

As known in the art, a voltage is applied to the steering line 405, sufficient to change/set the capacitance value of a main variable capacitance 425. The variation of the main variable capacitance 425, together with the other capacitance values of an input capacitance network, effectively determines the output frequency of the VCO circuit.

In accordance with the preferred embodiment of the present invention, a second variable capacitance 415 has been introduced for $C_x$. By providing a second variable capacitance 415 for $C_x$, located between the resonator 475 and transistor base 465 it is possible to attain a high capacitor value at small tuning voltages and a small capacitor value at high tuning voltages.

Notably, a resonator 475 is used in the preferred embodiment of the present invention, in contrast to an inductor. In this regard, the gain margin tuning process described above can be applied, using the second variable capacitor 415 and notably the resonator 475 as the frequency of operation of the circuit can be more accurately predicted.

Notably, the preferred embodiment of the present invention uses a resonator in contrast to an inductor due primarily to the following:
(i) The ability to provide a highly robust VCO design due to higher specification of resonator parameter accuracy; and
(ii) Reduced component tolerances, leading to reduce VCO sensitivity.

The preferred design was based on a 2 mm MURATA™ resonator 475 with the following parameters:
(i) Self-resonance frequency of 1350 MHz;
(ii) A relative permittivity ($E_r$) of 92;
(iii) The additional (second) variable capacitor 415 from Infineon™-BBY58_02W—was used; and
(iv) The combination of the variable capacitance $C_x$ and associated fixed capacitance $C_c$ (hereinafter referred to as C3) was set between 18 pF to 6.8 pF The desired performance was also based on the following parameters:
(i) Tuning range of 0.5 V–4.5 V to support the oscillation band and tolerances;
(ii) Phase noise performance to be no worse than –122 dBc/Hz @ 50 kHz offset, over the frequency band;
(iii) A supply voltage of 2.4 V;
(iv) Ic<=5.6 mA; and
(v) A requirement for the VCO to start oscillating at all tuning voltages, 0 V to 5 V.

TABLE 2

Wide Band Low Noise VCO Using Gain Margin Tuning
Wide Band Low Noise VCO Using Gain Margin Tuning

| Parameter | Tuning Voltage [V] | | |
|---|---|---|---|
|  | 0.5 | 2.5 | 4.5 |
| C3_Modified [pF] | 18 | 10 | 6.8 |
| Frequency [MHz] | 751 | 805 | 871 |
| Phase Noise @ 12.5 kHz | –108 | –106 | –107 |
| Phase Noise @ 25 kHz | –115.5 | –115 | –117 |
| Phase Noise @ 50 kHz | –124 | –122 | –123.5 |
| Phase Noise @ 100 kHz | –129.5 | –128 | –129 |
| Phase Noise @ 250 kHz | –136.5 | –137 | –136.5 |

Thus, it can be seen that good VCO phase noise stability can be attained over a wideband (15%) tuning frequency band using gain margin tuning, i.e. 0.5V to 4.5V applied to C3.

In an enhanced embodiment of the present invention, the inductor 417 located on the VCO steering line is operably coupled to an additional digital-to-analogue converter (DAC). In this configuration, the inductor 417 is fed using an independent DAC voltage. By applying a voltage to the additional variable capacitance in this manner, VCO sensitivity is improved.

Although the present invention has been described with reference to a VCO operable over the TETRA UHF frequency band, i.e. the oscillator centre frequency following a divide-by-two function, it is envisaged that the inventive concepts described herein are equally applicable for any wideband VCO design requiring high phase noise performance. Clearly, for other wireless communication products, other circuit configurations may also be used, and the configuration and circuit component values illustrated in FIG. 4 are only a preferred example.

Furthermore, although the present invention has been described with reference to a Colpitts design, a skilled artisan will appreciate that the inventive concepts are equally applicable to other VCO designs. In particular, it is envisaged that other circuit topographies can be used, for example, where the additional variable capacitor is not located on a transistor base, noting that the gain margin may change dramatically.

The present topography is based on a location and value of the resonator 475. The preferred location is substantially adjacent to the resonator 475. In this regard, the adjacent positioning of the second variable capacitance encompasses the second variable capacitance being located on the steering voltage line. Furthermore, the second variable capacitance is preferably located adjacent to the resonator 475, inasmuch as they are preferably both part of the VCO feedback network. In addition, the adjacent positioning of the second variable capacitance is preferably located between the resonator 475 and a base port of the active transistor device 450.

A skilled artisan would appreciate that alternative 'adjacent' locations of the second (additional) variable capacitance 415 with respect to the resonator 475 and the active device 450 may be used. In this regard, the term 'adjacent', when referring to the locations of two components, should not necessarily be solely considered as the two components being spatially or electrically positioned next to each other within the VCO circuit.

In addition, it is envisaged that integrated circuit manufacturers are able to manufacture integrated circuits to perform voltage controlled oscillator functions based on the new configuration, as hereinbefore described.

Additionally, the preferred embodiment of the present invention is illustrated with the active device being a bi-polar transistor. However, it is envisaged that a field-effect transistor arrangement will benefit equally from the inventive concepts described herein. Also, although the preferred range of $C_x$ values is between 12 pF and 3 pF with a low tuning voltage range of 0.5V to 2.5V and a high tuning voltage range of 2.5V to 4.5V, a skilled artisan will appreciate that other values and other ranges can be used for different products and different frequency ranges.

It will be understood that the VCO design enabling selection of a VCO operating frequency using a variable capacitance $C_x$ as described above, provides either singly or in combination at least one or more of the following advantages:

(i) It enables a VCO design to operate over a wider bandwidth with the same tuning voltages, say around 15% of the VCO's centre frequency;

(ii) It provides an increase in loaded-Q at high tuning voltages, i.e. it provides better phase noise at those frequencies;

(iii) It provides an increase in gain margin at low frequencies, i.e. it ensures a minimum gain margin to provide sufficient oscillation thereby providing greater start-up confidence at low tuning voltages;

(iv) It provides a VCO design with reduced Main variable capacitor coupling; and (v) It provides a more flexible design.

Whilst specific, and preferred, implementations of the present invention are described above, it is clear that one skilled in the art could readily apply variations and modifications of such inventive concepts.

Thus, a wireless communication unit, and a voltage controlled oscillator circuit have been provided where the disadvantages described with reference to prior art arrangements have been substantially alleviated.

The invention claimed is:

1. A wireless communication terminal comprising a voltage controlled oscillator comprising:
   an active device for producing a power gain;
   a first variable capacitance, operably coupled to the active device, providing a variable capacitance value based on a voltage applied on a steering line; and
   a feedback network comprising a resonator that is operably coupled to an output of the active device and that is coupled in parallel to the first variable capacitance and a capacitor in series with the first variable capacitance, for feeding power back to an input of the active device to sustain oscillations;
   and wherein the voltage controlled oscillator further includes a second variable capacitance which is operably coupled to receive a control voltage from the steering line via an isolator inductor common to the first variable capacitance, wherein the second variable capacitance is coupled in series between the resonator and the active device and is not directly connected to the first variable capacitance.

2. The wireless communication terminal according to claim 1, wherein the active device comprises a transistor.

3. The wireless communication terminal according to claim 2, wherein the transistor has a base electrode and the second variable capacitance is connected between the resonator and the base electrode of the transistor.

4. The wireless communication terminal according to claim 1, wherein the second variable capacitance is operably configured such that, when a high tuning voltage is applied, a loaded-Q value of the voltage controlled oscillator is increased.

5. The wireless communication terminal according to claim 1, wherein the second variable capacitance is operably configured such that, when a low tuning voltage is applied, a gain margin of the voltage controlled oscillator is increased to a level sufficient to provide oscillations.

6. The wireless communication terminal according to claim 1, wherein the second variable capacitance provides a capacitance in a range of about 12 pF to about 3 pF.

7. The wireless communication terminal according to claim 1, wherein in operation there is applied alternatively to the steering line a low tuning voltage in a range of about 0V to about 2.5V and a high tuning voltage in a range of about 2.5V to about 4.5V.

8. The wireless communication terminal according to claim 1, further comprising an inductor located on the steering line between the second variable capacitance and a digital-to-analogue converter, such that an independent voltage can be applied from the digital-to-analogue converter to the second variable capacitance.

9. The wireless communication terminal according to claim 1, wherein the voltage controlled oscillator comprises a Colpitts configured voltage controlled oscillator.

10. The wireless communication terminal according to claim 1, wherein the wireless communication terminal is operable according to operational standards selected from TETRA and GSM standards and is capable of generating radio frequency signals across two distinct operational frequency bands.

11. The wireless communication terminal according to claim 1, wherein the wireless communication terminal comprises a device selected from a portable radio, a mobile radio, a mobile telephone, a personal digital assistant and a wireless capable laptop computer.

12. A voltage controlled oscillator circuit suitable for use in a wireless communication terminal, the voltage controlled oscillator circuit comprising:
   an active device for producing a power gain;
   a first variable capacitance operably coupled to the active device and providing a variable capacitance value based on an applied steering line control voltage; and
   a feedback network comprising a resonator that is operably coupled to an output of the active device and that is coupled in parallel to the first variable capacitance and a capacitor in series with the first variable capacitance, for feeding power back to an input of the active device to sustain oscillations;
   and a second variable capacitance operably coupled to receive a control voltage from the steering line via an isolator inductor common to the first variable capacitance, wherein the second variable capacitance is coupled in series between the resonator and the active device and is not directly connected to the first variable capacitance.

* * * * *